(12) United States Patent
Takeguchi et al.

(10) Patent No.: US 11,769,661 B2
(45) Date of Patent: Sep. 26, 2023

(54) SUBSTRATE PROCESSING METHOD AND SUBSTRATE PROCESSING APPARATUS

(71) Applicant: Tokyo Electron Limited, Tokyo (JP)

(72) Inventors: Hirofumi Takeguchi, Koshi (JP); Kazuyoshi Shinohara, Koshi (JP); Takahisa Otsuka, Koshi (JP); Suguen Lee, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/881,306

(22) Filed: May 22, 2020

(65) Prior Publication Data
US 2020/0381245 A1 Dec. 3, 2020

(30) Foreign Application Priority Data

May 27, 2019 (JP) .................... 2019-098501

(51) Int. Cl.
| | | |
|---|---|---|
| H01L 21/02 | (2006.01) | |
| H01L 21/67 | (2006.01) | |
| H01L 21/687 | (2006.01) | |
| B08B 3/08 | (2006.01) | |
| B08B 3/10 | (2006.01) | |

(52) U.S. Cl.
CPC .......... *H01L 21/02057* (2013.01); *B08B 3/08* (2013.01); *B08B 3/10* (2013.01); *H01L 21/67051* (2013.01); *H01L 21/68764* (2013.01); *B08B 2203/005* (2013.01); *B08B 2203/007* (2013.01)

(58) Field of Classification Search
None
See application file for complete search history.

(56) References Cited

U.S. PATENT DOCUMENTS

| | | | |
|---|---|---|---|
| 6,589,338 B1 * | 7/2003 | Nakamori | H01L 21/67051 257/E21.228 |
| 2003/0034056 A1 * | 2/2003 | Amai | H01L 21/67051 134/109 |
| 2008/0017222 A1 * | 1/2008 | Miya | H01L 21/6708 134/21 |
| 2008/0156349 A1 * | 7/2008 | Kim | C11D 11/0047 134/3 |
| 2009/0229641 A1 * | 9/2009 | Yoshida | B08B 3/14 134/107 |
| 2012/0073609 A1 * | 3/2012 | Hashimoto | H01L 21/67051 134/95.1 |
| 2018/0358241 A1 * | 12/2018 | Lee | H01L 21/02052 |
| 2019/0131144 A1 * | 5/2019 | Iwahata | H01L 21/67253 |

FOREIGN PATENT DOCUMENTS

| | | |
|---|---|---|
| JP | H07-050282 A | 2/1995 |
| JP | H11-121427 A | 4/1999 |
| JP | 2007-258462 A | 10/2007 |
| JP | 2019-079995 A | 5/2019 |

* cited by examiner

*Primary Examiner* — Mikhail Kornakov
*Assistant Examiner* — Ryan L Coleman
(74) *Attorney, Agent, or Firm* — Pearne & Gordon LLP

(57) ABSTRACT

A substrate processing method includes a first cleaning process and a second cleaning process. In the first cleaning process, a substrate is cleaned with a first cleaning solution. In the second cleaning process, the substrate is cleaned with a second cleaning solution having a lower cleanliness than the first cleaning solution after the first cleaning process.

5 Claims, 16 Drawing Sheets

SUBSTRATE PROCESSING METHOD AND SUBSTRATE PROCESSING APPARATUS

CROSS-REFERENCE TO RELATED APPLICATION

This application claims the benefit of Japanese Patent Application No. 2019-098501 filed on May 27, 2019, the entire disclosure of which is incorporated herein by reference.

TECHNICAL FIELD

The exemplary embodiments described herein pertain generally to a substrate processing method and a substrate processing apparatus.

BACKGROUND

Conventionally, there has been known a technique of cleaning a substrate such as a semiconductor wafer (hereinafter, also referred to as "wafer") with a cleaning solution (see Patent Document 1).

Patent Document 1: Japanese Patent Laid-open Publication No. 2007-258462

SUMMARY

In one exemplary embodiment, a substrate processing method includes cleaning a substrate with a first cleaning solution; and cleaning the substrate with a second cleaning solution having a lower cleanliness than the first cleaning solution after the cleaning of the substrate with the first cleaning solution.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
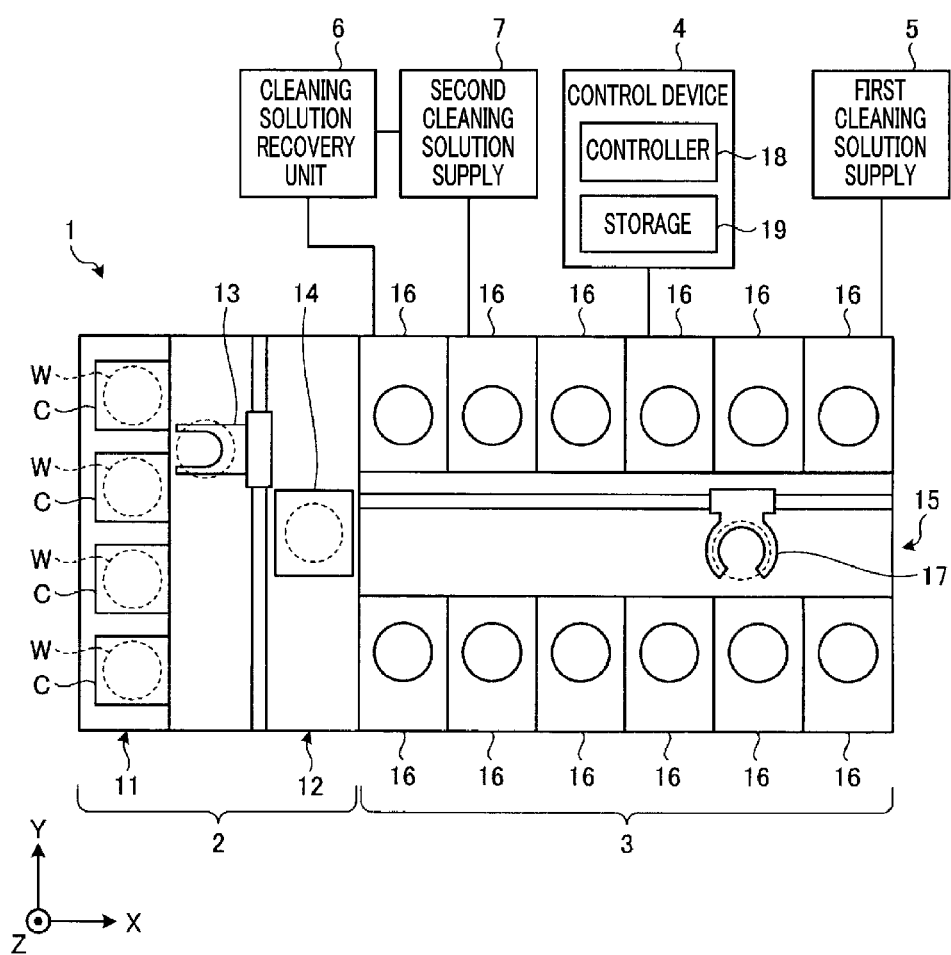
FIG. 1 is a diagram schematically illustrating a configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing method and a substrate processing apparatus according to the present disclosure will be described in detail with reference to the accompanying drawings. Further, the present disclosure is not limited to the following exemplary embodiments. Furthermore, it is to be noted that the drawings are illustrative of the invention, and a relationship between the sizes of components and the proportions of the respective components can be different from the real ones. Also, the drawings may be different from each other in a relationship between the sizes of components and the proportions of the respective components.

There has been known a technique of cleaning a substrate such as a semiconductor wafer (hereinafter, also referred to as "wafer") with a cleaning solution. In some cases, the cleaning solution used in the cleaning processing is recovered to be used again in the cleaning processing in view of cost or the like.

Since the recovered cleaning solution has a lower cleanliness than a new cleaning solution, it has been difficult to sufficiently remove particles from the substrate in the cleaning processing.

Accordingly, a technique of sufficiently removing the particles from the substrate even with the cleaning solution having the low cleanliness is required.

<Outline of Substrate Processing System>

First, a schematic configuration of a substrate processing system 1 according to an exemplary embodiment will be described with reference to FIG. 1. FIG. 1 is a diagram schematically illustrating the configuration of the substrate processing system 1 according to the exemplary embodiment. The substrate processing system 1 is an example of a substrate processing apparatus. In the following, in order to clarify positional relationships, the X-axis, Y-axis and Z-axis which are orthogonal to each other will be defined, and the positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to accommodate therein a plurality of substrates, e.g., semiconductor wafers W in the present exemplary embodiment (hereinafter, referred to as "wafers W"), horizontally.

The transfer section 12 is provided adjacent to the carrier placing section 11 and equipped with a substrate transfer device 13 and a delivery unit 14 therein. The substrate transfer device 13 is equipped with a wafer holding mechanism configured to hold a wafer W. Further, the substrate transfer device 13 is movable in a horizontal direction and a vertical direction and pivotable around a vertical axis, and transfers the wafer W between the carriers C and the delivery unit 14 by using the wafer holding mechanism.

The processing station 3 is provided adjacent to the transfer section 12. The processing station 3 is equipped with a transfer section 15 and a plurality of processing units 16. Each processing unit 16 is an example of a substrate processor. The plurality of processing units 16 is arranged on both sides of the transfer section 15.

The transfer section 15 is equipped with a substrate transfer device 17 therein. The substrate transfer device 17 is equipped with a wafer holding mechanism configured to hold the wafer W. Further, the substrate transfer device 17 is movable in the horizontal direction and the vertical direction and pivotable around a vertical axis, and transfers the wafer W between the delivery unit 14 and the processing units 16 by using the wafer holding mechanism.

Each processing unit 16 is configured to perform a predetermined substrate processing on the wafer W transferred by the substrate transfer device 17. The processing unit 16 will be described in detail later.

Further, the substrate processing system 1 is equipped with a control device 4. The control device 4 is, for example, a computer and includes a controller 18 and a storage 19. The storage 19 stores a program that controls various processings performed in the substrate processing system 1.

The controller 18 controls the operations of the substrate processing system 1 by reading and executing the program stored in the storage 19.

Furthermore, the program may be recorded in a computer-readable storage medium and installed from the storage medium to the storage 19 of the control device 4. The computer-readable storage medium includes, for example, a hard disk (HD), a flexible disk (FD), a compact disk (CD), a magneto-optical disk (MO), and a memory card.

The substrate processing system 1 also includes a first cleaning solution supply 5, a cleaning solution recovery unit 6 and a second cleaning solution supply 7. The first cleaning solution supply 5 is configured to supply a first cleaning solution to the processing unit 16 during a cleaning processing on the wafer W.

The cleaning solution recovery unit 6 is configured to recover the cleaning solution used in the cleaning processing on the wafer W. The second cleaning solution supply 7 is configured to supply a second cleaning solution to the processing unit 16 during the cleaning processing on the wafer W. The second cleaning solution has a lower cleanliness than the first cleaning solution. The first cleaning solution supply 5, the cleaning solution recovery unit 6 and the second cleaning solution supply 7 will be described in detail later.

In the substrate processing system 1 configured as described above, the substrate transfer device 13 of the carry-in/out station 2 first takes out a wafer W from a carrier C placed in the carrier placing section 11 and then places the wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16 and then carried out from the processing unit 16 to be placed on the delivery unit 14 by the substrate transfer device 17. After processed and placed on the delivery unit 14, the wafer W is returned to the carrier C of the carrier placing section 11 by the substrate transfer device 13.

<Configuration of Processing Unit>

Figure 2:
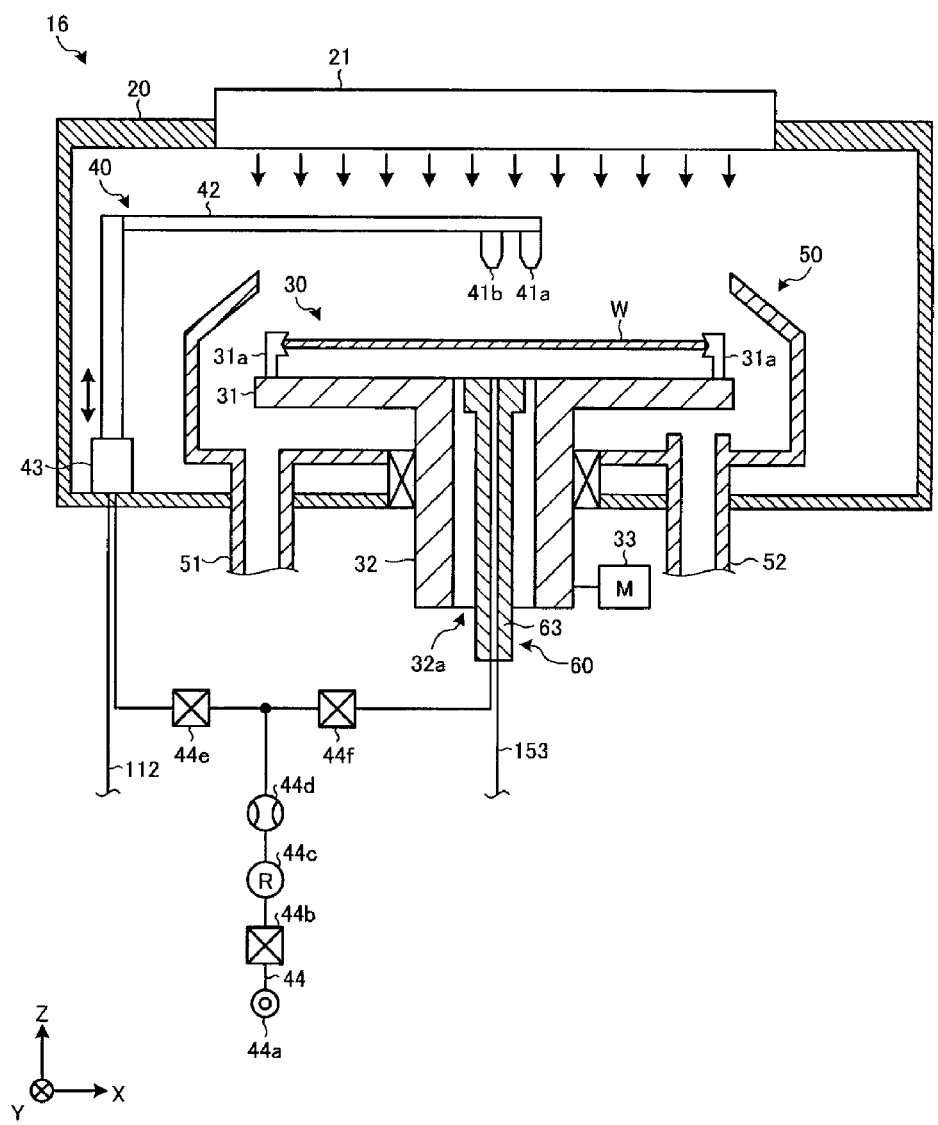
FIG. 2 is a diagram schematically illustrating a configuration example of a processing unit according to the exemplary embodiment.

Hereinafter, a configuration of the processing unit 16 will be described with reference to FIG. 2. FIG. 2 is a diagram schematically illustrating a configuration example of the processing unit 16. As illustrated in FIG. 2, the processing unit 16 is equipped with a chamber 20, a liquid processor 30, a top surface supply 40, a recovery cup 50 and a bottom surface supply 60.

The chamber 20 accommodates at least some of the liquid processor 30, the top surface supply 40, the recovery cup 50 and the bottom surface supply 60. At a ceiling portion of the chamber 20, a fan filter unit (FFU) 21 is provided. The FFU 21 forms a downflow in the chamber 20.

The liquid processor 30 is equipped with a holder 31, a support 32 and a driver 33 and performs a liquid processing on the wafer W placed thereon. The holder 31 holds the wafer W horizontally. The support 32 is a member extending vertically, and a base end portion thereof is supported rotatably by the driver 33 while holding the holder 31 horizontally on a tip end portion thereof. The driver 33 rotates the support 32 around a vertical axis.

By rotating the support 32 with the driver 33, the liquid processor 30 rotates the holder 31 supported by the support 32, thereby rotating the wafer W held on the holder 31.

On a top surface of the holder 31 of the liquid processor 30, a holding member 31a is provided to hold the wafer W by its sides. The wafer W is horizontally held by the holding member 31a in a state where the wafer W is separated slightly from the top surface of the holder 31. Also, the wafer W is held by the holder 31 in a state where a surface of the wafer W to which the substrate processing is to be performed faces upward.

The top surface supply 40 supplies a processing fluid to a top surface (hereinafter, also referred to as "front surface") of the wafer W. The top surface supply 40 is equipped with nozzles 41a and 41b placed at the front surface side of the wafer W, an arm 42 configured to support the nozzles 41a and 41b horizontally and a pivotable elevating mechanism 43 configured to pivot and elevate the arm 42.

The nozzle 41a is connected to a cleaning solution supply line 112. The nozzle 41a is configured to discharge a cleaning solution supplied through the cleaning solution supply line 112 to the front surface of the wafer W. A line configuration of the substrate processing system 1 including the cleaning solution supply line 112 will be described later.

The nozzle 41b is connected to a functional water supply line 44. The nozzle 41b is configured to discharge functional water supplied through the functional water supply line 44 to the front surface of the wafer W. The functional water may be an alkaline rinse solution, for example, ammonia water, electrolytic ionized water, hydrogen water, or ozone water.

A functional water source 44a, a valve 44b, a constant pressure valve 44c, a flowmeter 44d and a valve 44e are provided at the functional water supply line 44 sequentially from an upstream side. The functional water source 44a is, for example, a tank that stores therein the functional water.

The constant pressure valve 44c is configured to control a flow rate of the functional water supplied to the functional water supply line 44 based on a flow rate of the functional water measured by the flowmeter 44d. That is, the constant pressure valve 44c performs a feedback control based on the flow rate of the functional water measured by the flowmeter 44d.

Further, the functional water supply line 44 is branched between the flowmeter 44d and the valve 44e, and the branched line is connected to a nozzle 61b of the bottom surface supply 60 (see FIG. 4A to FIG. 4C) via a valve 44f.

The recovery cup 50 is placed to surround the holder 31 and is configured to collect a processing solution scattered from the wafer W by the rotation of the holder 31. A drain port 51 is formed at a bottom portion of the recovery cup 50, and the processing solution collected by the recovery cup 50 is discharged through the drain port 51 to the outside of the processing unit 16. Further, an exhaust port 52 is formed at the bottom portion of the recovery cup 50 to discharge the gas supplied from the FFU 21 to the outside of the processing unit 16.

The bottom surface supply 60 is inserted through a hollow portion 32a of the support 32 and the holder 31 to supply a processing fluid to a bottom surface (hereinafter, also referred to as "rear surface") of the wafer W. The bottom surface supply 60 is equipped with nozzles 61a and 61b (see FIG. 4A to FIG. 4C) placed at the rear surface side of the wafer W, an arm 62 (see FIG. 4A to FIG. 4C) configured to support the nozzles 61a and 61b horizontally and a moving mechanism 63 configured to move the arm 62.

The nozzle 61a is connected to a branch line 153. The nozzle 61a is configured to discharge the second cleaning solution supplied through the branch line 153 to the rear surface of the wafer W. The branch line 153 will be described in detail later.

The nozzle 61b is connected to the functional water supply line 44. The nozzle 61b is configured to discharge the functional water supplied through the functional water supply line 44 to the rear surface of the wafer W.

<Line Configuration of Substrate Processing System>

Figure 3:
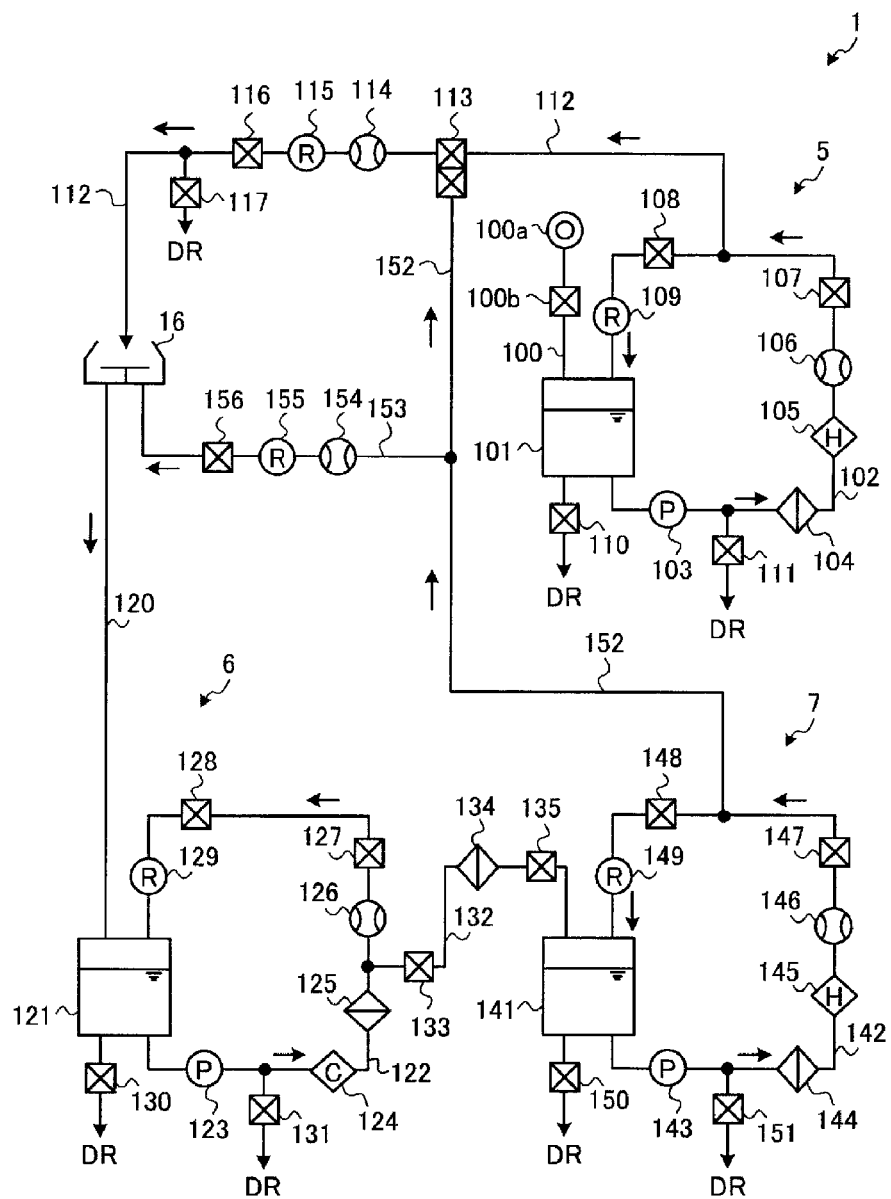
FIG. 3 is a diagram schematically illustrating a line configuration of the substrate processing system according to the exemplary embodiment.

Hereinafter, the line configuration of the substrate processing system 1 will be described with reference to FIG. 3. FIG. 3 is a diagram schematically illustrating the line configuration of the substrate processing system 1 according to the exemplary embodiment.

As illustrated in FIG. 3, the substrate processing system 1 according to the exemplary embodiment includes the first cleaning solution supply 5, the processing unit 16, the cleaning solution recovery unit 6 and the second cleaning solution supply 7.

The first cleaning solution supply 5 supplies the first cleaning solution to the processing unit 16. In the exemplary embodiment, the first cleaning solution is a new cleaning solution which has not yet been used. Therefore, in the following, the first cleaning solution will also be referred to as "new solution".

Further, the cleaning solution used in the cleaning processing according to the exemplary embodiment is an acid-based cleaning solution such as DSP (mixed solution of deionized water, sulfuric acid, hydrofluoric acid and hydrogen peroxide), BHF (buffered hydrofluoric acid) or DHF (diluted hydrofluoric acid). Further, the cleaning processing according to the exemplary embodiment is performed to remove particles which are residues on the surface of, for example, a dry-etched wafer W.

The first cleaning solution supply 5 is equipped with a first cleaning solution supply line 100, a tank 101 and a circulation line 102. The first cleaning solution supply line 100 supplies the first cleaning solution to the tank 101.

A first cleaning solution source 100a and a valve 100b are provided at the first cleaning solution supply line 100 sequentially from an upstream side. The first cleaning solution source 100a is, for example, a tank that stores therein the first cleaning solution (new solution).

The tank 101 stores therein the first cleaning solution supplied through the first cleaning solution supply line 100. The circulation line 102 is a circulation line that starts from the tank 101 and returns to the tank 101.

A pump 103, a filter 104, a heater 105, a flowmeter 106, a valve 107, a valve 108 and a constant pressure valve 109 are provided at the circulation line 102 sequentially from an upstream side.

The pump 103 forms a circulating flow of the first cleaning solution, which starts from the tank 101, passes through the circulation line 102 and returns to the tank 101. The filter 104 removes contaminants, such as particles, contained in the first cleaning solution circulating in the circulation line 102.

The heater 105 heats the first cleaning solution circulating in the circulation line 102. The flowmeter 106 measures a flow rate of the first cleaning solution circulating in the circulation line 102. The constant pressure valve 109 controls a flow rate of the first cleaning solution circulating in the circulation line 102.

Further, the tank 101 is connected to a drain unit DR via a valve 110, and the circulation line 102 is connected to the drain unit DR via a valve 111. Thus, when the first cleaning solution in the tank 101 or the circulation line 102 is exchanged, the controller 18 (see FIG. 1) may control the valves 110 and 111 to discharge the first cleaning solution in the tank 101 or the circulation line 102 to the drain unit DR.

Furthermore, the cleaning solution supply line 112 is branched between the valve 107 and the valve 108 in the circulation line 102. The cleaning solution supply line 112 is provided between the first cleaning solution supply 5 and the processing unit 16 and supplies the first cleaning solution, on which a filtration processing and a temperature control processing are performed in the first cleaning solution supply 5, to the processing unit 16.

A joint unit 113, a flowmeter 114, a constant pressure valve 115 and a valve 116 are provided at the cleaning solution supply line 112 sequentially from an upstream side. The joint unit 113 is connected to a second cleaning solution supply line 152 and supplied with the second cleaning solution from the second cleaning solution supply 7 which will be descried in detail later.

That is, the cleaning solution supply line 112 may supply the first cleaning solution from the first cleaning solution supply 5 to the processing unit 16 and also supply the second cleaning solution from the second cleaning solution supply 7 to the processing unit 16.

The flowmeter 114 measures a flow rate of the first cleaning solution or the second cleaning solution passing through the cleaning solution supply line 112. The constant pressure valve 115 controls a flow rate of the first cleaning solution or the second cleaning solution passing through the cleaning solution supply line 112.

Further, the cleaning solution supply line 112 is connected to a drain unit DR via a valve 117. Thus, when the cleaning solution in the cleaning solution supply line 112 is exchanged, the controller 18 may control the valve 117 to discharge the cleaning solution in the cleaning solution supply line 112 to the drain unit DR.

The drain port 51 (see FIG. 2) of the processing unit 16 is connected to the cleaning solution recovery unit 6 via a discharge line 120. Thus, the cleaning solution used in the cleaning processing on the wafer W in the processing unit 16 may be discharged to the cleaning solution recovery unit 6.

The cleaning solution recovery unit 6 recovers the cleaning solution used in the cleaning processing on the wafer W in the processing unit 16. The cleaning solution recovery unit 6 is equipped with a tank 121 connected to the discharge line 120 and a circulation line 122.

The tank 121 stores therein the cleaning solution used in the processing unit 16. The circulation line 122 is a circulation line that starts from the tank 121 and returns to the tank 121.

A pump 123, a chiller 124, a filter 125, a flowmeter 126, a valve 127, a valve 128 and a constant pressure valve 129 are provided at the circulation line 122 sequentially from an upstream side with respect to the tank 121.

The pump 123 forms a circulating flow of the used cleaning solution, which starts from the tank 121, passes through the circulation line 122 and returns to the tank 121. The chiller 124 cools the used cleaning solution circulating in the circulation line 122.

The filter 125 removes contaminants, such as particles, contained in the used cleaning solution which has been cooled in the chiller 124. In the exemplary embodiment, the used cleaning solution which has been cooled in the chiller 124 is filtered by the filter 125, and, thus, the used cleaning solution can be used again in the cleaning processing on the wafer W.

The flowmeter 126 measures a flow rate of the used cleaning solution circulating in the circulation line 122. The constant pressure valve 129 controls a flow rate of the used cleaning solution circulating in the circulation line 122.

Further, the tank 121 is connected to a drain unit DR via a valve 130, and the circulation line 122 is connected to the drain unit DR via a valve 131. Thus, when the used cleaning solution in the tank 121 or the circulation line 122 is exchanged, the controller 18 may control the valves 130 and 131 to discharge the used cleaning solution in the tank 121 or the circulation line 122 to the drain unit DR.

Furthermore, a branch line 132 is branched between the filter 125 and the flowmeter 126 in the circulation line 122. The branch line 132 is provided between the cleaning solution recovery unit 6 and the second cleaning solution supply 7 and supplies the used cleaning solution, on which a filtration processing is performed in the cleaning solution recovery unit 6, to the second cleaning solution supply 7.

A valve 133, a filter 134 and a valve 135 are provided at the branch line 132 sequentially from an upstream side. The filter 134 removes contaminants, such as particles, contained in the used cleaning solution passing through the branch line 132.

The second cleaning solution supply 7 supplies the used cleaning solution, on which the filtration processing is performed in the cleaning solution recovery unit 6, as a second cleaning solution to the processing unit 16. Although the filtration processing is performed on the second cleaning solution in the cleaning solution recovery unit 6, it has already been used in the processing unit 16. Thus, the second cleaning solution has a lower cleanliness than the first cleaning solution which has not yet been used. In the following, the second cleaning solution will also be referred to as "recovered solution".

The second cleaning solution supply 7 is equipped with a tank 141 connected to the branch line 132 and a circulation line 142. The tank 141 stores therein the second cleaning solution, on which the filtration processing is performed in the cleaning solution recovery unit 6. The circulation line 142 is a circulation line that starts from the tank 141 and returns to the tank 141.

A pump 143, a filter 144, a heater 145, a flowmeter 146, a valve 147, a valve 148 and a constant pressure valve 149 are provided at the circulation line 142 sequentially from an upstream side with respect to the tank 141.

The pump 143 forms a circulating flow of the second cleaning solution, which starts from the tank 141, passes through the circulation line 142 and returns to the tank 141. The filter 144 removes contaminants, such as particles, contained in the second cleaning solution circulating in the circulation line 142.

The heater 145 heats the second cleaning solution circulating in the circulation line 142. The flowmeter 146 measures a flow rate of the second cleaning solution circulating in the circulation line 142. The constant pressure valve 149 controls a flow rate of the second cleaning solution circulating in the circulation line 142.

Further, the tank 141 is connected to a drain unit DR via a valve 150, and the circulation line 142 is connected to the drain unit DR via a valve 151. Thus, when the second cleaning solution in the tank 141 or the circulation line 142 is exchanged, the controller 18 may control the valves 150 and 151 to discharge the second cleaning solution in the tank 141 or the circulation line 142 to the drain unit DR.

Furthermore, the second cleaning solution supply line 152 is branched between the valve 147 and the valve 148 in the circulation line 142. The second cleaning solution supply line 152 is provided between the second cleaning solution supply 7 and the joint unit 113 in the cleaning solution supply line 112 and supplies the second cleaning solution, on which a temperature control processing is performed in the second cleaning solution supply 7, to the cleaning solution supply line 112.

Further, the branch line 153 is branched from the second cleaning solution supply line 152. The branch line 153 is connected to the bottom surface supply 60 (see FIG. 2) of the processing unit 16 and supplies the second cleaning solution, on which the temperature control processing is performed in the second cleaning solution supply 7, to the bottom surface supply 60.

A flowmeter 154, a constant pressure valve 155 and a valve 156 are provided at the branch line 153 sequentially from an upstream side. The flowmeter 154 measures a flow rate of the second cleaning solution circulating in the branch line 153. The constant pressure valve 155 controls a flow rate of the second cleaning solution circulating in the branch line 153.

<Substrate Processing>

Figure 4A:
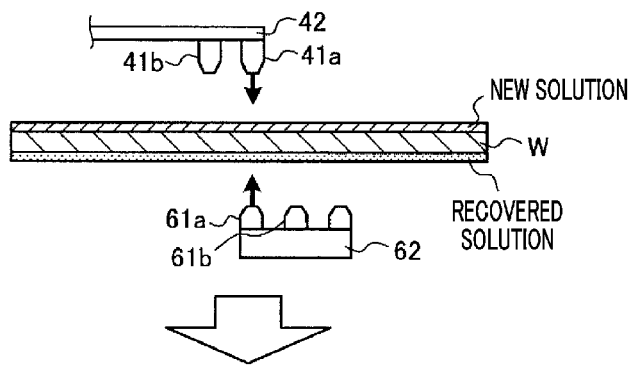
FIG. 4A to FIG. 4C are provided to explain a sequence of a substrate processing according to the exemplary embodiment.
Figure 4B:
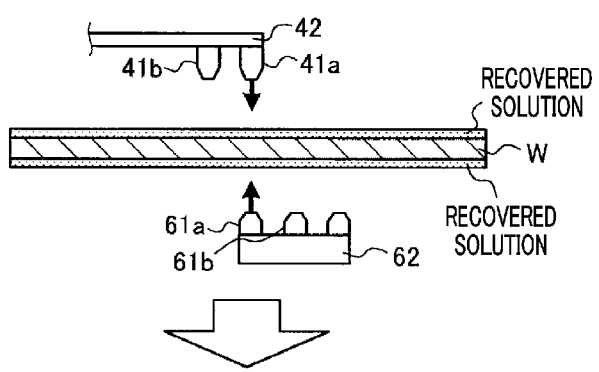
Figure 4C:
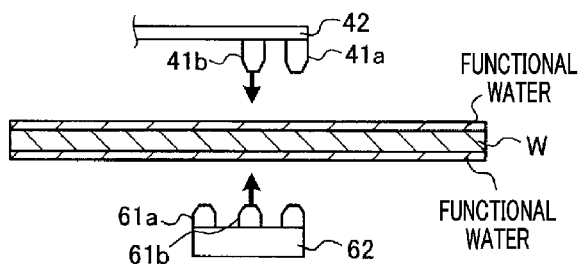

Hereinafter, a substrate processing according to the exemplary embodiment will be described in detail with reference to FIG. 4A to FIG. 7. FIG. 4A to FIG. 4C are provided to explain a sequence of the substrate processing according to the exemplary embodiment.

As illustrated in FIG. 4A, the substrate processing system 1 (see FIG. 2) controls the nozzle 41a to perform a first cleaning processing of cleaning the front surface of the wafer W, which has been dry-etched, with the first cleaning solution (new solution). Through the first cleaning processing, the substrate processing system 1 can remove particles attached to the front surface of the wafer W.

Further, in the first cleaning processing, the substrate processing system 1 controls the nozzle 61a to clean the rear surface of the wafer W with the second cleaning solution (recovered solution). Thus, the substrate processing system 1 can remove particles attached to the rear surface of the wafer W.

Then, as illustrated in FIG. 4B, the substrate processing system 1 controls the nozzle 41a to perform a second cleaning processing of cleaning the front surface of the wafer W with the second cleaning solution (recovered solution). Through the second cleaning processing, the substrate processing system 1 can remove particles, which cannot be removed through the first cleaning processing, from the front surface.

Then, in the second cleaning processing, the substrate processing system 1 also cleans the rear surface of the wafer W with the second cleaning solution (recovered solution).

Thereafter, as illustrated in FIG. 4C, the substrate processing system 1 controls the nozzle 41b to perform a rinse processing of rinsing the front surface of the wafer W with the functional water. Through the rinse processing, the substrate processing system 1 can remove the cleaning solution remaining on the front surface of the wafer W.

Further, in the rinse processing, the substrate processing system 1 controls the nozzle 61b to rinse the rear surface of the wafer W with the functional water. Thus, the substrate processing system 1 can remove the cleaning solution remaining on the rear surface of the wafer W.

Finally, the substrate processing system 1 controls the liquid processor 30 (see FIG. 2) to perform a dry processing (e.g., spin dry) on the wafer W (illustration thereof is omitted).

As described above, in the exemplary embodiment, to remove the particles attached to the front surface of the wafer W, the front surface of the wafer W is cleaned first with the new solution having a high cleanliness and then cleaned with the recovered solution having a low cleanliness.

Figure 5:
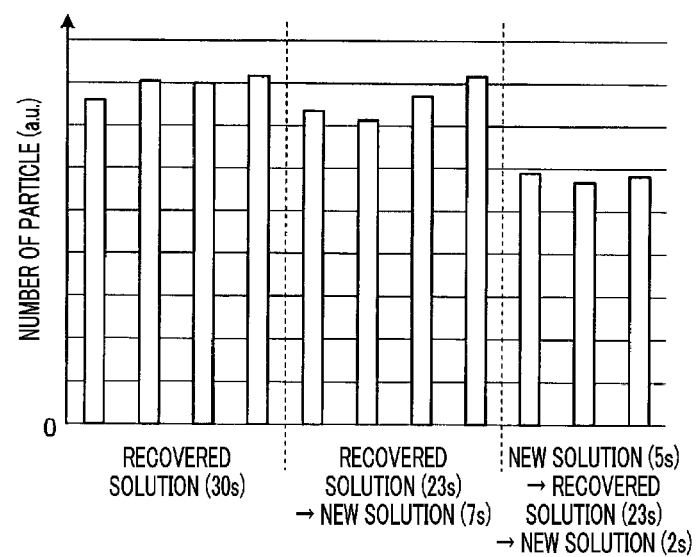
FIG. 5 shows differences based on supply timings of a recovered solution and a new solution in the substrate processing according to the exemplary embodiment.

Herein, if the new solution and the recovered solution are separately used in the cleaning processing on the wafer W, a relationship between supply timings of these cleaning solutions and the particles remaining on the wafer W is as follows. FIG. 5 shows differences based on the supply timings of the recovered solution and the new solution in the substrate processing according to the exemplary embodiment.

FIG. 5 shows the result of an example where the flow rate of the cleaning solution discharged to the front surface of the wafer W is set to 1500 mL/min, the flow rate of the cleaning solution discharged to the rear surface of the wafer W is set to 1000 mL/min, and a time period of processing with the cleaning solution is set to 30 seconds.

As illustrated in FIG. 5, when the recovered solution is used throughout the entire time period (30 seconds) of the cleaning processing, the number of particles remaining on the wafer W after the cleaning processing increases due to the low cleanliness of the recovered solution.

When the recovered solution is used for a first time period (23 seconds) of the cleaning processing and the new solution is used for a next time period (7 seconds), the number of particles remaining on the wafer W after the cleaning processing shows little change compared with the case where the recovered solution is used throughout the entire time period.

It is assumed that this is because if the recovered solution having the low cleanliness is used for the first time period, the particles can be firmly attached onto the wafer W during the first time period, which makes it difficult to remove the firmly attached particles even when the new solution is used for the next time period.

Meanwhile, as shown in the above-described exemplary embodiment, when the new solution is used for a first time period (5 seconds) and the recovered solution is used for a next time period (23 seconds) and then the new solution is used for a last time period (2 seconds), the total length of the time period using the new solution is not changed. However, the number of particles remaining on the wafer W greatly decreases.

It is assumed that this is because if the new solution having the high cleanliness is used for the first time period, it is possible to suppress the firm attachment of the particles onto the wafer W and thus possible to efficiently remove the particles.

As described above, in the exemplary embodiment, the new solution having the high cleanliness is used for a first time period of the cleaning processing and the recovered solution having the low cleanliness is used for a next time period. Thus, even if the recovered solution having the low cleanliness is used, it is possible to sufficiently remove the particles from the front surface of the wafer W.

Further, in the exemplary embodiment, the recovered solution can be used in the cleaning processing. Thus, it is possible to reduce the amount of the new solution required for the cleaning solution. Therefore, according to the exemplary embodiment, it is possible to reduce the cost of the cleaning processing.

Furthermore, as illustrated in FIG. 4A to FIG. 4C, in the cleaning processing according to the exemplary embodiment, the amount of particles attached to the rear surface of the wafer W is smaller than the amount of particles attached to the front surface. Therefore, the cleaning of the rear surface with the recovered solution having the low cleanliness has no problem associated with practical use.

Also, if the rear surface of the wafer W is cleaned with the recovered solution through the entire time period, it is possible to further reduce the amount of the new solution required for the cleaning processing. Therefore, it is possible to further reduce the cost of the cleaning processing.

Figure 6:
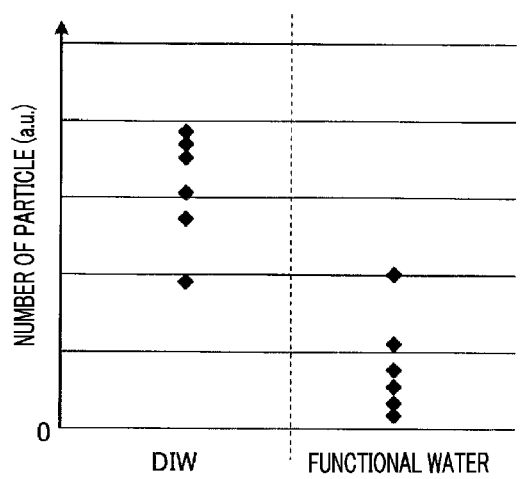
FIG. 6 shows differences between DIW and functional water in a rinse processing according to the exemplary embodiment.

Further, in the exemplary embodiment, the functional water may be used in the rinse processing. FIG. 6 shows differences between the DIW and the functional water in the rinse processing according to the exemplary embodiment.

FIG. 6 shows the result of an example where diluted ammonia water having a concentration of 3 ppmw and a temperature of 25° C. is used as the functional water and the flow rate of DIW and the functional water discharged to the front surface and the rear surface of the wafer W is set to 1500 mL/min in addition to the same conditions as in the example shown in FIG. 5.

As illustrated in FIG. 6, when the functional water is used in the rinse processing, the number of particles remaining on the wafer W decreases compared with a case where the DIW is used in the rinse processing.

It is assumed that this result can be obtained for the following reason. Since the alkaline functional water is used in the rinse processing, the surfaces of particles remaining on the wafer W can be negatively charged in view of zeta potential.

Further, the surface of the wafer W formed of silicon is negatively charged, and, thus, in the exemplary embodiment, it is possible to suppress the attachment of the particles negatively charged by the functional water.

Furthermore, it has been described in the exemplary embodiment that the rinse processing is performed using the functional water. However, the rinse processing may be performed using an alkaline processing solution (e.g., SC1 (mixed solution of ammonia and hydrogen peroxide)).

Accordingly, it is possible to negatively charge the particles and also possible to remove the particles attached to a surface oxide film of the wafer W by performing micro-etching on the surface oxide film. Therefore, when the rinse processing is performed using the alkaline etching solution, it is possible to further reduce the number of particles remaining on the wafer W.

Figure 7:
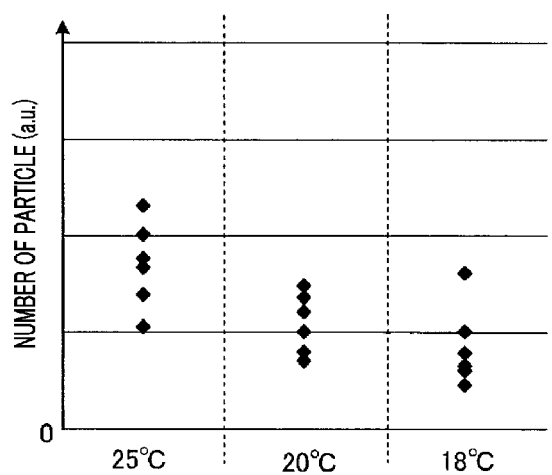
FIG. 7 shows differences in temperature of the recovered solution in a filtration processing according to the exemplary embodiment.

Also, in the exemplary embodiment, the filtration processing on the cleaning solution (e.g., recovered solution) may be performed at a temperature lower than room temperature (25° C.). FIG. 7 shows differences in temperature of the recovered solution in the filtration processing according to the exemplary embodiment.

FIG. 7 shows the result of an example where the flow rate of the cleaning solution discharged to the front surface of the wafer W is set to 1500 mL/min, the flow rate of the cleaning solution discharged to the rear surface of the wafer W is set to 1000 mL/min, and a time period of processing with the cleaning solution is set to 250 seconds.

As illustrated in FIG. 7, when the filtration processing is performed at temperatures (20° C., 18° C.) lower than the room temperature, the number of particles remaining on the wafer W decreases compared with a case where the filtration processing is performed at the room temperature (25° C.).

It is assumed that this result can be obtained for the following reason. In the filtration processing performed at a temperature (hereinafter, simply referred to as "low temperature") lower than the room temperature, a membrane inside the filter 125 (see FIG. 3) contracts compared with the filtration processing performed at the room temperature.

Thus, the diameter of the membrane decreases. Therefore, the filter 125 can collect smaller particles. According to the exemplary embodiment, it is possible to improve the filtration capability of the filter 125.

Also, in the filtration processing at the low temperature, the amount of particles eluted from the membrane of the filter 125 can be reduced compared with the filtration processing performed at the room temperature. Accordingly, it is also possible to improve the filtration capability of the filter 125.

Various Modification Examples

Hereinafter, various modification examples of the exemplary embodiment will be described with reference to FIG. 8A to FIG. 16C. FIG. 8A to FIG. 8D are provided to explain a sequence of a substrate processing according to a modification example 1 of the exemplary embodiment. Also, in the following examples, descriptions of the same processings as in the exemplary embodiment illustrated in FIG. 4A to FIG. 4C will be omitted.

Figure 8A:
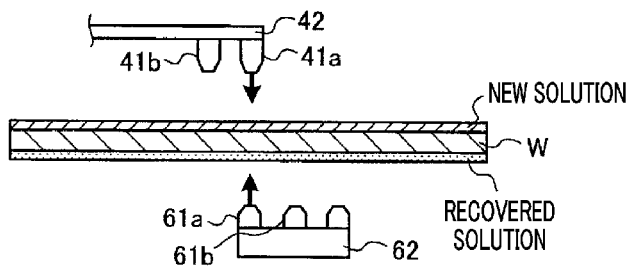
FIG. 8A to FIG. 8D are provided to explain a sequence of a substrate processing according to a modification example 1 of the exemplary embodiment.
Figure 8B:
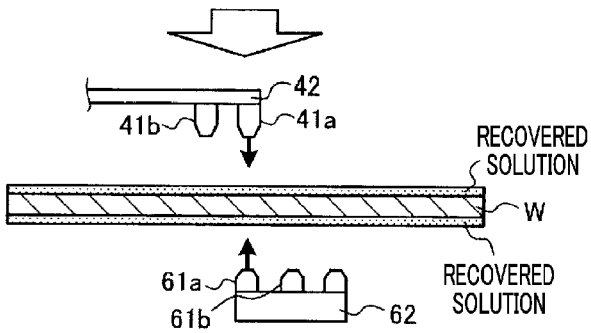

As illustrated in FIG. 8A, the substrate processing system 1 (see FIG. 2) controls the nozzle 41a to clean the front surface of the wafer W, which has been dry-etched, with the first cleaning solution (new solution). Then, as illustrated in FIG. 8B, the substrate processing system 1 controls the nozzle 41a to clean the front surface of the wafer W with the second cleaning solution (recovered solution).

Figure 8C:
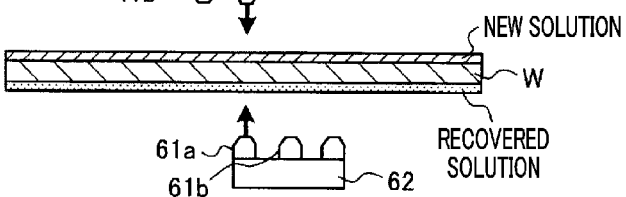
Figure 8D:
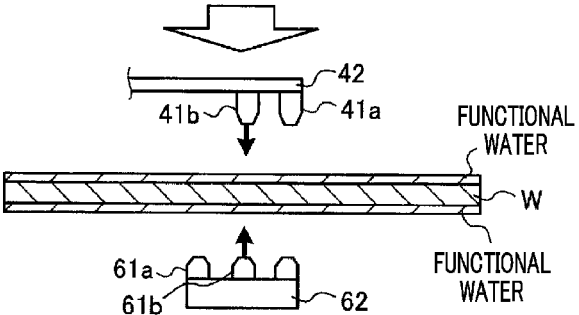

Thereafter, as illustrated in FIG. 8C, the substrate processing system 1 controls the nozzle 41a to clean the front surface of the wafer W with the first cleaning solution (new solution). Then, as illustrated in FIG. 8D, the substrate processing system 1 controls the nozzle 41b to rinse the front surface of the wafer W with the functional water. Finally, the substrate processing system 1 performs the dry processing on the wafer W (illustration thereof is omitted).

That is, in the modification example 1, the cleaning processing using the first cleaning solution is added between the second cleaning processing and the rinse processing according to the exemplary embodiment. Thus, it is possible to remove the particles, which cannot be removed through the second cleaning processing, from the front surface.

Therefore, according to the modification example 1, even if the recovered solution having the low cleanliness is used, it is possible to more sufficiently remove the particles from the front surface of the wafer W.

Figure 9A:
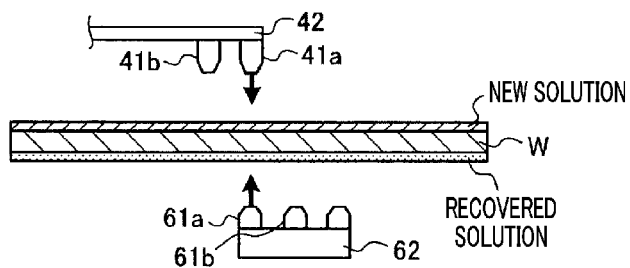
FIG. 9A to FIG. 9D are provided to explain a sequence of a substrate processing according to a modification example 2 of the exemplary embodiment.

FIG. 9A to FIG. 9D are provided to explain a sequence of a substrate processing according to a modification example 2 of the exemplary embodiment. As illustrated in FIG. 9A, the substrate processing system 1 (see FIG. 2) controls the nozzle 41a to clean the front surface of the wafer W, which has been dry-etched, with the first cleaning solution (new solution).

Figure 9B:
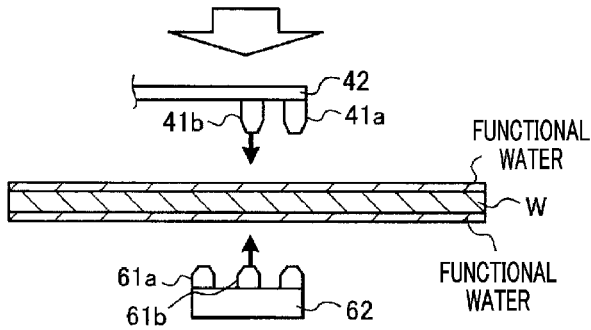
Figure 9C:
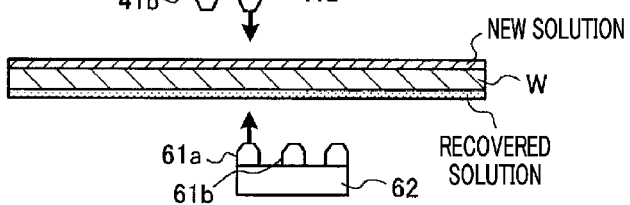

Then, as illustrated in FIG. 9B, the substrate processing system 1 controls the nozzle 41b to rinse the front surface of the wafer W with the functional water. Thereafter, as illustrated in FIG. 9C, the substrate processing system 1 controls the nozzle 41a to clean the front surface of the wafer W with the first cleaning solution (new solution).

Figure 9D:
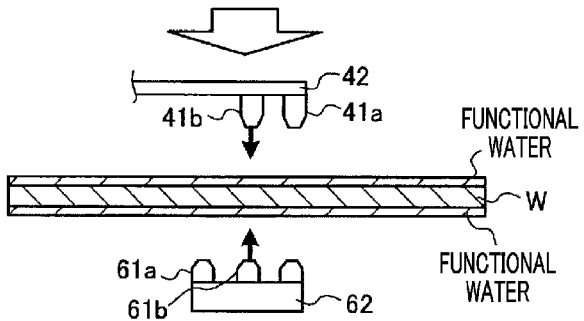

Then, as illustrated in FIG. 9D, the substrate processing system 1 controls the nozzle 41b to rinse the front surface of the wafer W with the functional water. Finally, the substrate processing system 1 performs the dry processing on the wafer W (illustration thereof is omitted).

That is, in the modification example 2, the rinse processing is added between the two cleaning processings using the first cleaning solution. Thus, it is possible to remove the particles, which cannot be removed through the cleaning processing performed first time, from the front surface. Therefore, according to the modification example 2, it is possible to sufficiently remove the particles from the front surface of the wafer W.

Figure 10A:
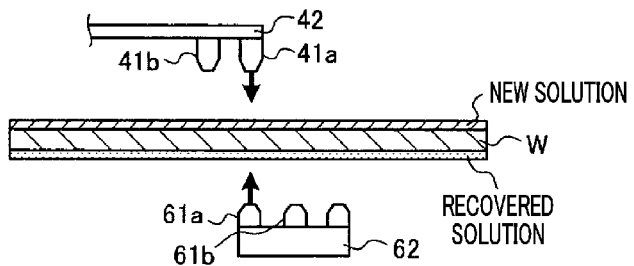
FIG. 10A to FIG. 10D are provided to explain a sequence of a substrate processing according to a modification example 3 of the exemplary embodiment.

FIG. 10A to FIG. 10D are provided to explain a sequence of a substrate processing according to a modification example 3 of the exemplary embodiment. As illustrated in FIG. 10A, the substrate processing system 1 (see FIG. 2) controls the nozzle 41a to clean the front surface of the wafer W, which has been dry-etched, with the first cleaning solution (new solution).

Figure 10B:
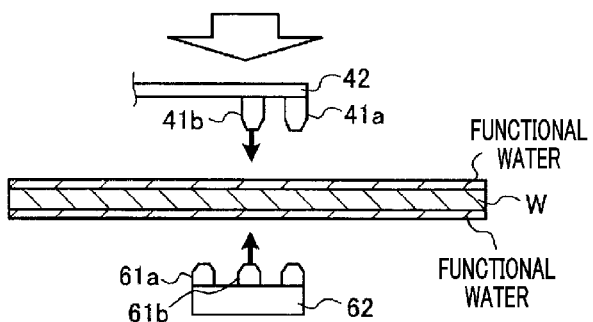
Figure 10C:
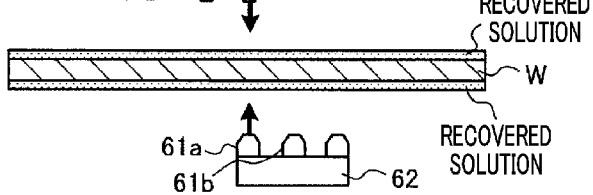

Then, as illustrated in FIG. 10B, the substrate processing system 1 controls the nozzle 41b to rinse the front surface of the wafer W with the functional water. Thereafter, as illustrated in FIG. 10C, the substrate processing system 1 controls the nozzle 41a to clean the front surface of the wafer W with the second cleaning solution (recovered solution).

Figure 10D:
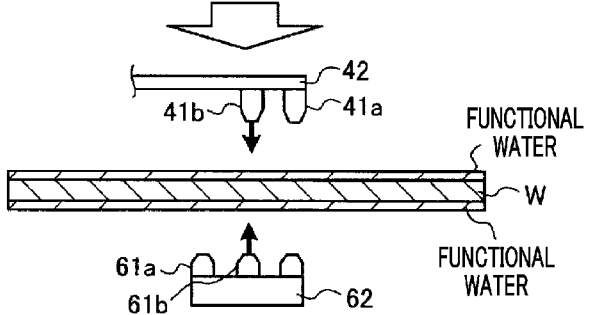

Then, as illustrated in FIG. 10D, the substrate processing system 1 controls the nozzle 41b to rinse the front surface of the wafer W with the functional water. Finally, the substrate processing system 1 performs the dry processing on the wafer W (illustration thereof is omitted).

That is, in the modification example 3, the rinse processing is added between the first cleaning processing and the second cleaning processing. Thus, it is possible to remove the particles, which cannot be removed through the first cleaning processing, from the front surface.

Therefore, according to the modification example 3, even if the recovered solution having the low cleanliness is used, it is possible to more sufficiently remove the particles from the front surface of the wafer W.

Figure 11:
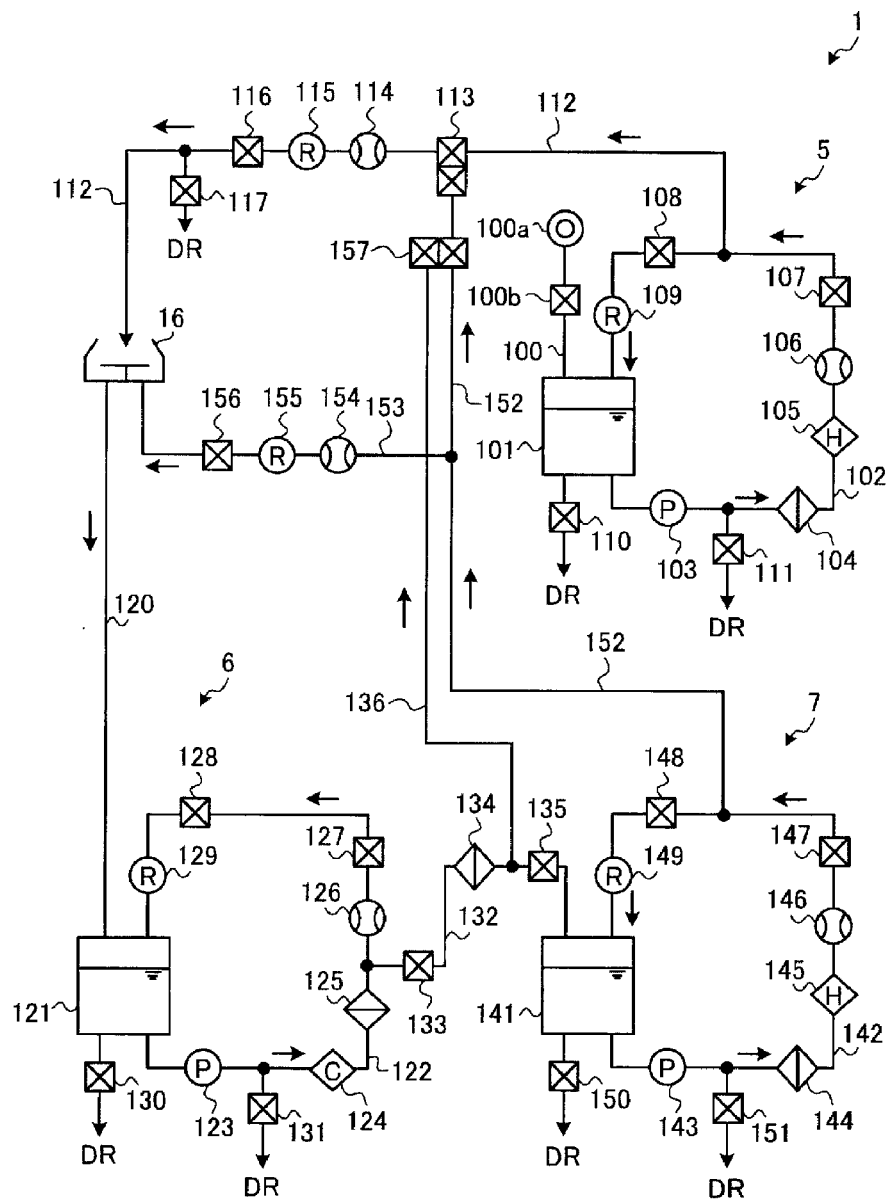
FIG. 11 is a diagram schematically illustrating a line configuration of a substrate processing system according to a modification example 4 of the exemplary embodiment.

FIG. 11 is a diagram schematically illustrating a line configuration of a substrate processing system 1 according to a modification example 4 of the exemplary embodiment. As illustrated in FIG. 11, the substrate processing system 1 of the modification example 4 is different from that of the exemplary embodiment in that a second cleaning solution supply line 136 configured to supply a second cleaning solution from the cleaning solution recovery unit 6 to the processing unit 16 is provided. Therefore, in the following example, components similar or corresponding to those of the above-described embodiment illustrated in FIG. 3 will be assigned similar reference numerals, and detailed descriptions thereof will be omitted.

The second cleaning solution supply line 136 is branched between the filter 134 and the valve 135 in the branch line 132. Also, a joint unit 157 is provided at the second cleaning solution supply line 152, and the second cleaning solution supply line 136 is connected to the joint unit 157.

Thus, the substrate processing system 1 according to the modification example 4 can supply a recovered solution, on which a filtration processing is performed at a low temperature in the cleaning solution recovery unit 6 and remains at the low temperature, to the processing unit 16.

Figure 12A:
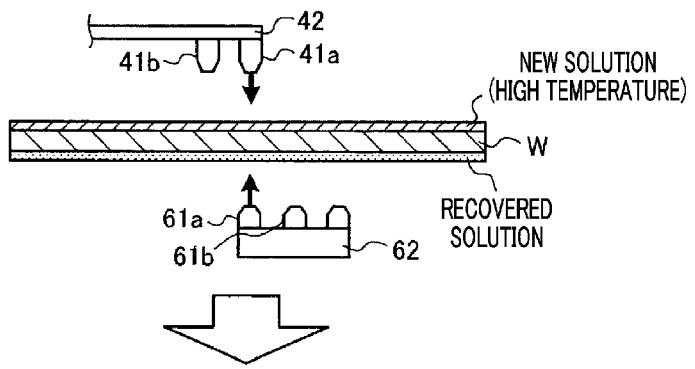
FIG. 12A to FIG. 12C are provided to explain a sequence of a substrate processing according to the modification example 4 of the exemplary embodiment.
Figure 12B:
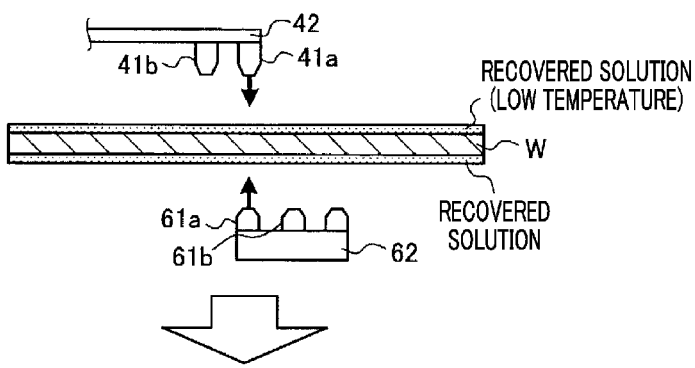
Figure 12C:
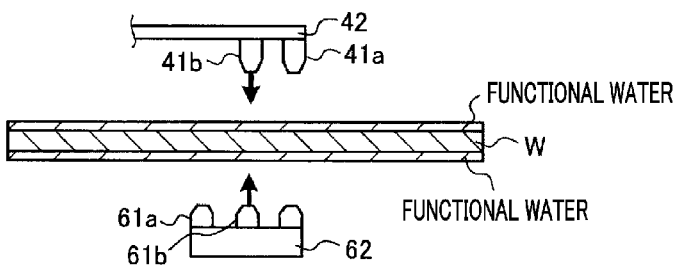

FIG. 12A to FIG. 12C are provided to explain a sequence of a substrate processing according to the modification example 4 of the exemplary embodiment. As illustrated in FIG. 12A, the substrate processing system 1 (see FIG. 11) controls the nozzle 41a to clean the front surface of the wafer W, which has been dry-etched, with the first cleaning solution (new solution) having a high temperature. The high temperature new solution can be prepared by heating the new solution with the heater 105 (see FIG. 11) of the first cleaning solution supply 5.

As such, by cleaning the front surface of the wafer W with the high temperature new solution, it is possible to increase the etching rate when the surface of the wafer W is etched with the cleansing solution, such as DSP or the like.

Then, as illustrated in FIG. 12B, the substrate processing system 1 controls the nozzle 41a to clean the front surface of the wafer W with the second cleaning solution (recovered solution) having a low temperature. The low temperature recovered solution is supplied from the cleaning solution recovery unit 6 through the second cleaning solution supply line 136.

As such, by cleaning the front surface of the wafer W with the low temperature recovered solution, it is possible to decrease the etching rate when the surface of the wafer W is etched with the cleansing solution. Thus, the total etched amount can be adjusted to a given value by combining the cleaning processing with the high temperature new solution and the cleaning processing with the low temperature recovered solution.

Then, as illustrated in FIG. 12C, the substrate processing system 1 controls the nozzle 41b to rinse the front surface of the wafer W with the functional water. Finally, the substrate processing system 1 performs the dry processing on the wafer W (illustration thereof is omitted).

Figure 13:
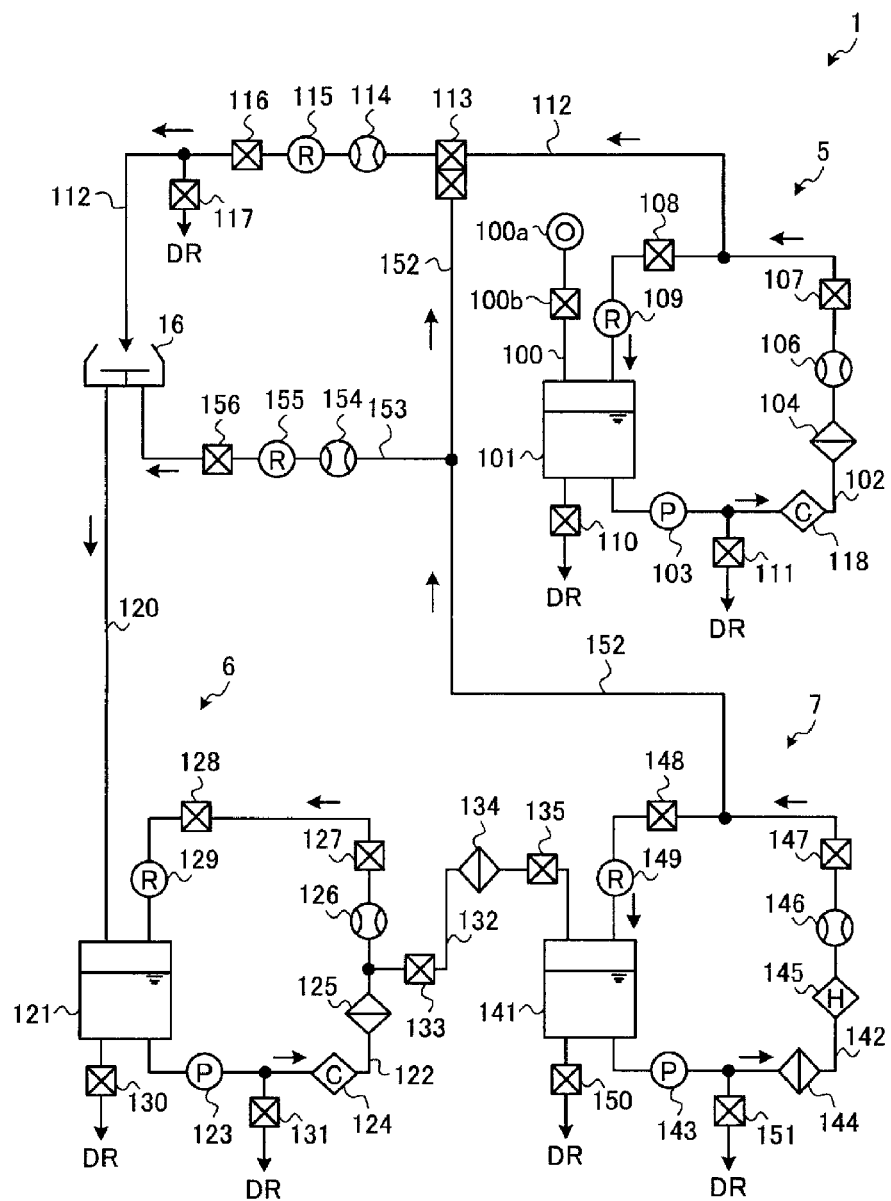
FIG. 13 is a diagram schematically illustrating a line configuration of a substrate processing system according to a modification example 5 of the exemplary embodiment.

FIG. 13 is a diagram schematically illustrating a line configuration of the substrate processing system 1 according to a modification example 5 of the exemplary embodiment. As illustrated in FIG. 13, the substrate processing system 1 of the modification example 5 is different from that of the exemplary embodiment in that a chiller 118 instead of the heater 105 is provided at the circulation line 102 of the first cleaning solution supply 5.

The chiller 118 is provided between the pump 103 and the filter 104 in the circulation line 102 and cools the first cleaning solution (new solution) circulating in the circulation line 102.

Since the chiller 118 is used in the modification example 5, the filtration processing on the first cleaning solution may be performed at a temperature lower than the room temperature. Therefore, according to the modification example 5, it is possible to further improve the cleanliness of the first cleaning solution, and, thus, it is possible to further reduce the number of particles remaining on the wafer W.

Also, in the modification example 5, the first cleaning solution supply 5 can supply the new solution, on which the filtration processing is performed at a low temperature and remains at the low temperature, to the processing unit 16.

Figure 14A:
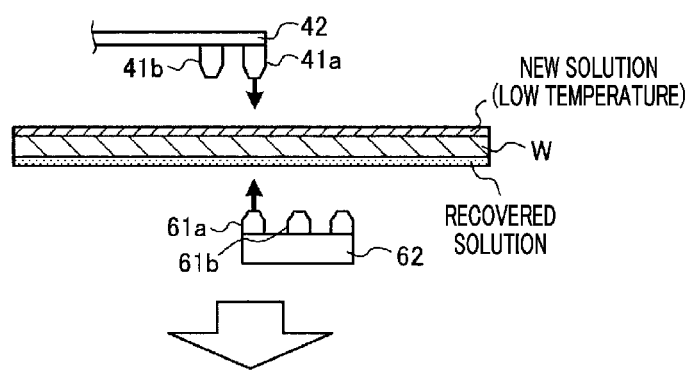
FIG. 14A to FIG. 14C are provided to explain a sequence of a substrate processing according to the modification example 5 of the exemplary embodiment.
Figure 14B:
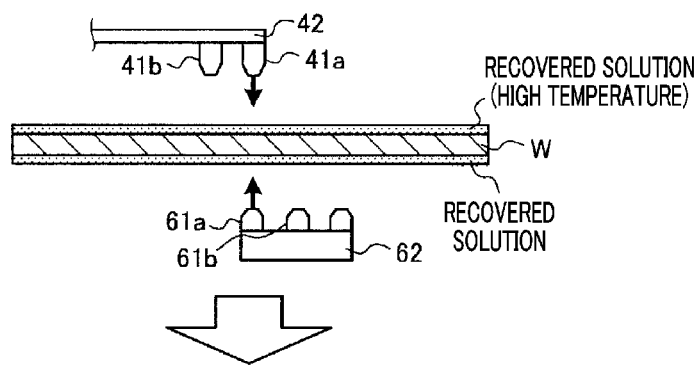
Figure 14C:
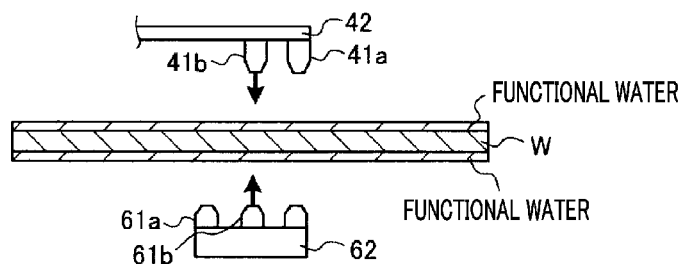

FIG. 14A to FIG. 14C are provided to explain a sequence of a substrate processing according to the modification example 5 of the exemplary embodiment. As illustrated in FIG. 14A, the substrate processing system 1 (see FIG. 13) controls the nozzle 41a to clean the front surface of the wafer W, which has been dry-etched, with the first cleaning solution (new solution) having the low temperature. The low temperature new solution is supplied from the first cleaning solution supply 5.

As such, by cleaning the front surface of the wafer W with the low temperature new solution, it may be difficult for the particles to be attached to the wafer W when the surface of the wafer W is etched with the cleansing solution, such as DSP or the like.

Thereafter, as illustrated in FIG. 14B, the substrate processing system 1 controls the nozzle 41a to clean the front surface of the wafer W with the second cleaning solution (recovered solution) having a high temperature. The high temperature recovered solution can be prepared by heating the recovered solution with the heater 145 of the second cleaning solution supply 7.

As such, by cleaning the front surface of the wafer W with the high temperature recovered solution, it is possible to increase the etching rate when the surface of the wafer W is etched with the cleansing solution. Thus, the total etched amount can be adjusted to a given value by combining the cleaning processing with the low temperature new solution and the cleaning processing with the high temperature recovered solution.

Then, as illustrated in FIG. 14C, the substrate processing system 1 controls the nozzle 41b to rinse the front surface of the wafer W with the functional water. Finally, the substrate processing system 1 performs the dry processing on the wafer W (illustration thereof is omitted).

In the exemplary embodiment and the modification examples described above, a non-used cleaning solution (i.e., new solution) has been used as the first cleaning solution, but the first cleaning solution of the exemplary embodiment is not limited to the non-used cleaning solution.

Figure 15:
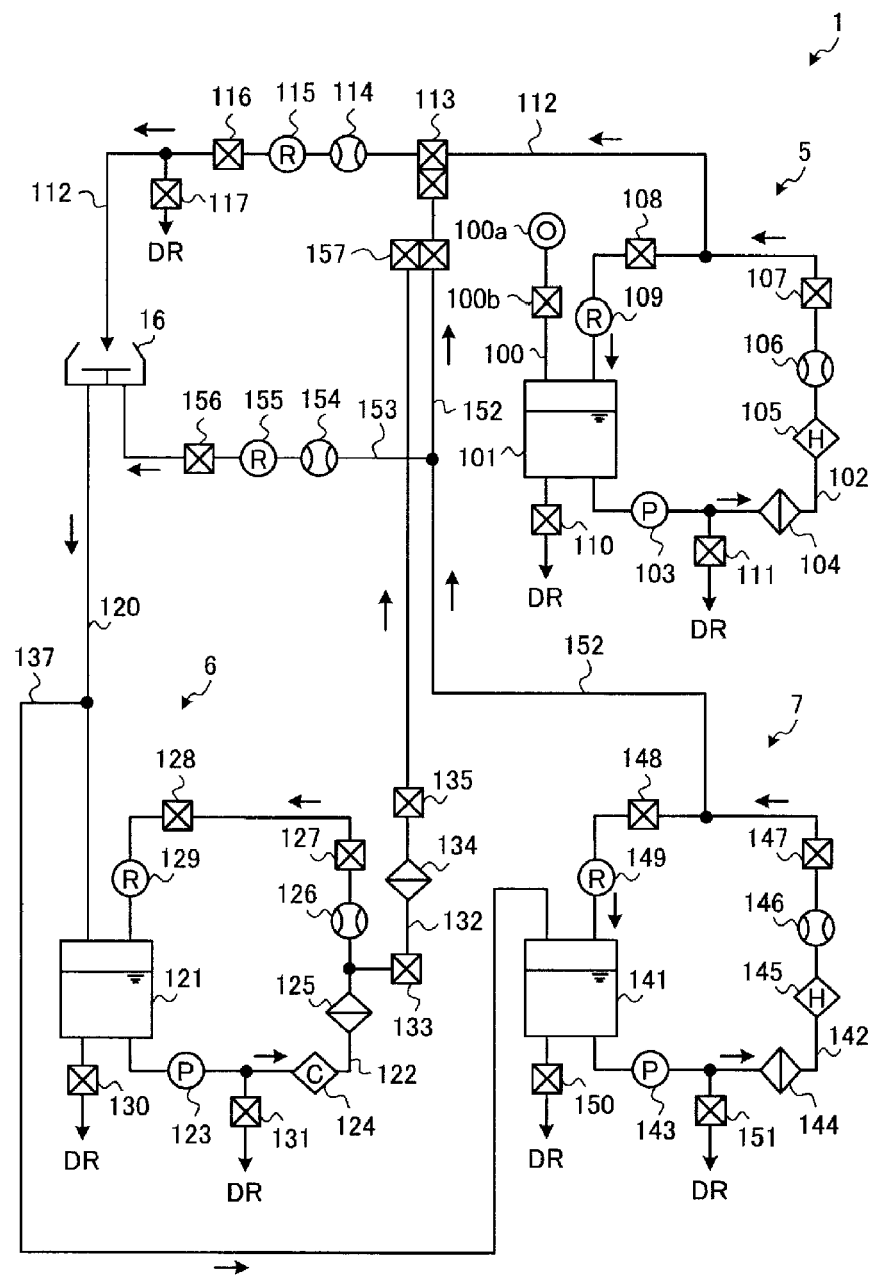
FIG. 15 is a diagram schematically illustrating a line configuration of a substrate processing system according to a modification example 6 of the exemplary embodiment.

FIG. 15 is a diagram schematically illustrating a line configuration of a substrate processing system 1 according to a modification example 6 of the exemplary embodiment. As illustrated in FIG. 15, the substrate processing system 1 of the modification example 6 is different from that of the modification example 4 in that the branch line 132 is connected only to the joint unit 157 and a branch line 137 is branched from the discharge line 120 and connected to the second cleaning solution supply 7.

The branch line 137 is provided between the processing unit 16 and the tank 141 of the second cleaning solution supply 7 via the discharge line 120. Through the branch line 137, the cleaning solution used in the processing unit 16 can be supplied directly to the second cleaning solution supply 7.

Therefore, according to the modification example 6, the filtration processing may be performed on the cleaning solution, which has been used in the processing unit 16, by the second cleaning solution supply 7 at a temperature (hereinafter, simply referred to as "high temperature") equal to or higher than the room temperature.

Also, in the modification example 6, the branch line 132 is connected to the joint unit 157 and thus can directly supply the recovered solution, on which the filtration processing is performed in the cleaning solution recovery unit 6 at the low temperature, to the processing unit 16.

Figure 16A:
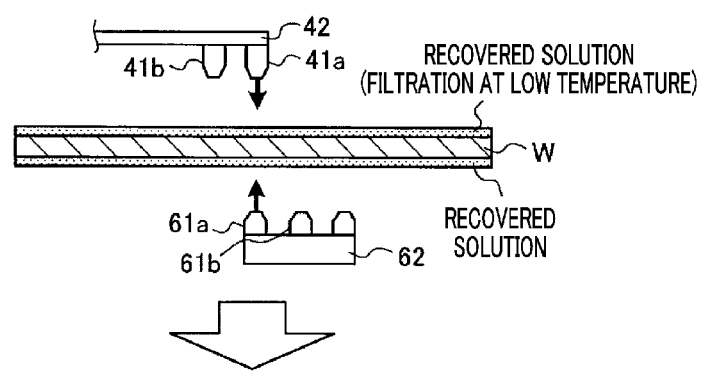
FIG. 16A to FIG. 16C are provided to explain a sequence of a substrate processing according to the modification example 6 of the exemplary embodiment.
Figure 16B:
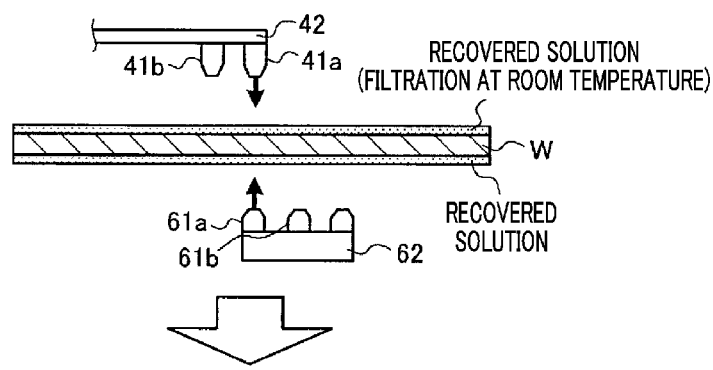
Figure 16C:
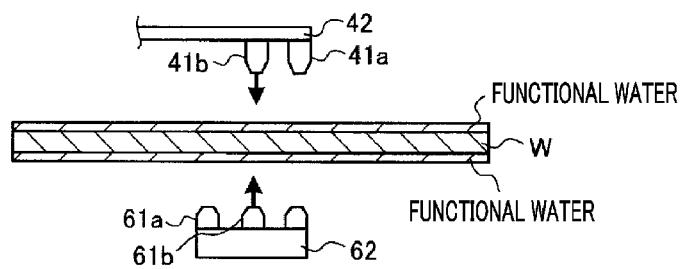

FIG. 16A to FIG. 16C are provided to explain a sequence of a substrate processing according to the modification example 6 of the exemplary embodiment. As illustrated in FIG. 16A, the substrate processing system 1 (see FIG. 15) controls the nozzle 41a to clean the front surface of the wafer W, which has been dry-etched, with the recovered solution, on which the filtration processing is performed at the low temperature.

Then, as illustrated in FIG. 16B, the substrate processing system 1 controls the nozzle 41a to clean the front surface of the wafer W with the recovered solution, on which the filtration processing is performed at the room temperature. Thereafter, as illustrated in FIG. 16C, the substrate processing system 1 controls the nozzle 41b to rinse the front surface of the wafer W with the functional water. Finally, the substrate processing system 1 performs the dry processing on the wafer W (illustration thereof is omitted).

In the modification example 6, the recovered solution, on which the filtration processing is performed at the low temperature, has a higher cleanliness than the recovered solution, on which the filtration processing is performed at the room temperature. That is, in the modification example 6, the recovered solution, on which the filtration processing is performed at the low temperature, serves as the first cleaning solution and the recovered solution, on which the filtration processing is performed at the room temperature, serves as the second cleaning solution.

In the modification example 6, the first cleaning solution having the higher cleanliness is used first for the cleaning processing and then, the second cleaning solution having the lower cleanliness is used for the cleaning processing. Thus, even if the low cleanliness recovered solution, on which the filtration processing is performed at the room temperature, is used, it is possible to sufficiently remove the particles from the front surface of the wafer W.

Also, in the modification example 6, the recovered solution can be used throughout the entire time period of the cleaning processing, and, thus, it is possible to reduce the amount of the new solution required for the cleaning processing. Therefore, according to the modification example 6, it is possible to further reduce the cost of the cleaning processing.

As described above, in the present disclosure, the cleaning solution having the higher cleanliness than the second cleaning solution can be used as the first cleaning solution. For example, the new solution, on which the filtration processing is performed at the low temperature, may be used as the first cleaning solution and the new solution, on which the filtration processing is performed at the room temperature or the high temperature, may be used as the second cleaning solution.

Otherwise, the new solution, on which the filtration processing is performed at the low temperature, may be used as the first cleaning solution and the recovered solution, on which the filtration processing is performed at the low temperature, the room temperature or the high temperature, may be used as the second cleaning solution.

Alternatively, the new solution, on which the filtration processing is performed at the room temperature or the high temperature, may be used as the first cleaning solution and the recovered solution, on which the filtration processing is performed at the low temperature, the room temperature or the high temperature, may be used as the second cleaning solution. Otherwise, the recovered solution, on which the filtration processing is performed at the room temperature, may be used as the first cleaning solution and the recovered solution, on which the filtration processing is performed at the high temperature, may be used as the second cleaning solution.

The substrate processing apparatus (substrate processing system 1) according to the exemplary embodiment includes the substrate processor (processing unit 16), the first cleaning solution supply 5, the cleaning solution recovery unit 6 and the second cleaning solution supply 7. The substrate processor (processing unit 16) is configured to process a substrate (wafer W). The first cleaning solution supply 5 is configured to supply a cleaning solution, which is not used, to the substrate processor (processing unit 16). The cleaning solution recovery unit 6 is configured to recover the cleaning solution, which is used in the substrate processor (processing unit 16). The second cleaning solution supply 7 is configured to supply the cleaning solution, which is used and recovered by the cleaning solution recovery unit 6, to the substrate processor (processing unit 16). Thus, even if the recovered solution having the low cleanliness is used, it is possible to sufficiently remove the particles from the wafer W.

Further, the substrate processing apparatus (substrate processing system 1) according to the exemplary embodiment further includes the controller 18 configured to control the substrate processor (processing unit 16), the first cleaning solution supply 5, the cleaning solution recovery unit 6 and the second cleaning solution supply 7. The controller 18 controls the first cleaning solution supply 5 to supply the cleaning solution which is not used and then controls the second cleaning solution supply 7 to supply the cleaning solution which is already used. Thus, even if the recovered solution having the low cleanliness is used, it is possible to sufficiently remove the particles from the wafer W.

Further, in the substrate processing apparatus (substrate processing system 1) according to the exemplary embodiment, the cleaning solution recovery unit 6 has the filter 125 configured to filter the recovered cleaning solution, and the filter 125 filters the recovered cleaning solution at a temperature lower than room temperature. Thus, it is possible to reduce the number of particles remaining on the wafer W.

<Sequence of Substrate Processing>

Figure 17:
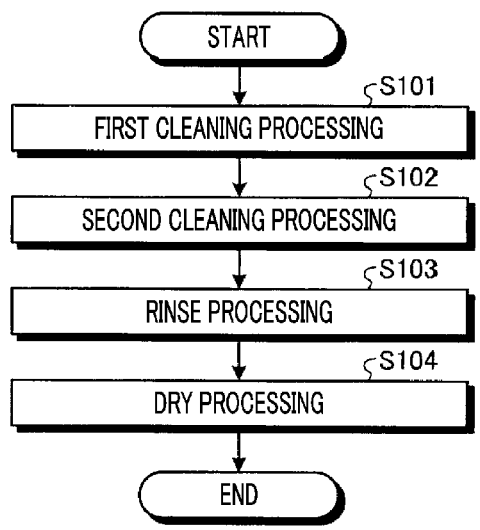
FIG. 17 is a flowchart showing a sequence of a substrate processing performed by the substrate processing system according to the exemplary embodiment.

Hereinafter, a sequence of the substrate processing according to the exemplary embodiment will be described with reference to FIG. 17. FIG. 17 is a flowchart showing a sequence of the substrate processing performed by the substrate processing system 1 according to the exemplary embodiment.

First, the controller 18 controls the first cleaning solution supply 5 and the processing unit 16 to perform the first cleaning processing of cleaning the wafer W with the first cleaning solution (process S101). Then, the controller 18 controls the second cleaning solution supply 7 and the processing unit 16 to perform the second cleaning processing of cleaning the wafer W with the second cleaning solution having the lower cleanliness than the first cleaning solution (process S102).

Thereafter, the controller 18 controls the functional water supply line 44 and the processing unit 16 to perform the rinse processing of rinsing the wafer W with the functional water (process S103). Then, the controller 18 controls the liquid processor 30 to perform the dry processing on the wafer W (process S104). When the process S104 is ended, a series of processing is completed.

A substrate processing method according to the exemplary embodiment includes a first cleaning process (process S101) and a second cleaning process (process S102). In the first cleaning process (process S101), a substrate (wafer W) is cleaned with a first cleaning solution. In the second cleaning process (process S102), after the first cleaning process (process S101), the substrate (wafer W) is cleaned with a second cleaning solution having a lower cleanliness than the first cleaning solution. Thus, even if the cleaning solution having the low cleanliness is used, it is possible to sufficiently remove the particles from the wafer W.

Also, in the substrate processing method according to the exemplary embodiment, the first cleaning solution is a cleaning solution which is not used and the second cleaning solution is a cleaning solution which is already used. Thus, it is possible to reduce the amount of the new solution required for the cleaning processing. Therefore, it is possible to reduce the cost of the cleaning processing.

Further, in the substrate processing method according to the exemplary embodiment, the second cleaning solution is a cleaning solution which is filtered at a temperature lower than room temperature after being used. Thus, it is possible to improve the cleanliness of the second cleaning solution. Therefore, it is possible to reduce the number of particles remaining on the wafer W.

Furthermore, in the substrate processing method according to the exemplary embodiment, the first cleaning solution is a cleaning solution which is filtered at a temperature lower than room temperature while being not used. Thus, it is possible to further improve the cleanliness of the first cleaning solution. Therefore, it is possible to further reduce the number of particles remaining on the wafer W.

Moreover, in the substrate processing method according to the exemplary embodiment, the first cleaning solution is a cleaning solution which is filtered at a temperature lower than room temperature after being used, and the second cleaning solution is a cleaning solution which is filtered at a temperature equal to or higher than the room temperature after being used. Thus, the recovered solution can be used throughout the entire time period of the cleaning processing. Therefore, it is possible to further reduce the amount of the new solution required for the cleaning processing.

Further, the substrate processing method according to the exemplary embodiment further includes a rinse process (process S103) of rinsing the substrate (wafer W) with functional water after the second cleaning process (process S102). Therefore, it is possible to further reduce the number of particles remaining on the wafer W.

Furthermore, in the substrate processing method according to the exemplary embodiment, in the first cleaning process (process S101), the substrate (wafer W) is cleaned with the first cleaning solution having a temperature equal to or higher than room temperature, and in the second cleaning process (process S102), the substrate (wafer W) is cleaned with the second cleaning solution having a temperature lower than the room temperature. Thus, the total etched amount can be adjusted to a given value.

Moreover, in the substrate processing method according to the exemplary embodiment, in the first cleaning process (process S101), the substrate (wafer W) is cleaned with the first cleaning solution having a temperature lower than room temperature, and in the second cleaning process (process S102), the substrate (wafer W) is cleaned with the second cleaning solution having a temperature equal to or higher than the room temperature. Thus, the total etched amount can be adjusted to a given value.

While the present disclosure has been described with reference to the exemplary embodiments, the present disclosure is not limited to the exemplary embodiments but may be variously modified without departing from the spirit thereof. For example, in the above-described exemplary embodiments, the acid-based cleaning solution such as DSP has been used as the cleaning solution, but the cleaning solution according to the exemplary embodiments is not limited to the acid-based cleaning solution.

Further, in the above-described exemplary embodiments, the first cleaning solution and the second cleaning solution have been described as different in the cleanliness but identical in kind. However, the first cleaning solution and the second cleaning solution may be different from each other in the cleanliness and the kind.

According to the exemplary embodiments, it is possible to sufficiently remove the particles from the substrate even with the cleaning solution having the low cleanliness.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing method, comprising:
    cleaning a first surface of a substrate with a first cleaning solution discharged from a first nozzle;
    cleaning the first surface with a second cleaning solution having a lower cleanliness than the first cleaning solution and discharged from the first nozzle after the cleaning of the substrate with the first cleaning solution;

cleaning the first surface of the substrate with a third cleaning solution discharged from the first nozzle after the cleaning of the substrate with the second cleaning solution; and cleaning a second surface of the substrate with the second cleaning solution discharged from a second nozzle different from the first nozzle;

wherein a total time period of the cleanings of the first surface with the first and third cleaning solutions is shorter than a time period of the cleaning of the first surface with the second cleaning solution, wherein the first and third cleaning solutions are unused cleaning solutions, and the second cleaning solution is a used cleaning solution recovered from the first cleaning solution.

2. The substrate processing method of claim 1,
wherein the second cleaning solution is a cleaning solution which is filtered at a temperature lower than room temperature after being used.

3. The substrate processing method of claim 1, further comprising:

rinsing the substrate with functional water after the cleaning of the first surface of the substrate with the second cleaning solution.

4. The substrate processing method of claim 1,
wherein in the cleaning of the first surface of the substrate with the first cleaning solution, the substrate is cleaned with the first cleaning solution having a temperature equal to or higher than room temperature, and in the cleaning of the first surface of the substrate with the second cleaning solution, the substrate is cleaned with the second cleaning solution having a temperature lower than the room temperature.

5. The substrate processing method of claim 3,
wherein in the cleaning of the first surface of the substrate with the first cleaning solution, the substrate is cleaned with the first cleaning solution having a temperature equal to or higher than room temperature, and in the cleaning of the first surface of the substrate with the second cleaning solution, the substrate is cleaned with the second cleaning solution having a temperature lower than the room temperature.

\* \* \* \* \*